(12) United States Patent
Wu et al.

(10) Patent No.: US 7,087,922 B2
(45) Date of Patent: Aug. 8, 2006

(54) LIGHT-EMITTING DIODE STRUCTURE

(75) Inventors: Liang-Wen Wu, Banciao (TW); Ru-Chin Tu, Tainan (TW); Cheng-Tsang Yu, Taichung (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 10/991,011

(22) Filed: Nov. 16, 2004

(65) Prior Publication Data

US 2006/0102909 A1 May 18, 2006

(51) Int. Cl.
*H01S 5/00* (2006.01)
*H01L 29/06* (2006.01)
*H01L 31/072* (2006.01)
*H01L 31/109* (2006.01)
*H01L 31/0328* (2006.01)

(52) U.S. Cl. .................... 257/13; 257/12; 257/79; 257/E33.023; 257/E33.025; 257/E33.028; 257/E33.033; 257/E33.034; 375/45.012; 375/50.1

(58) Field of Classification Search ............... 257/12, 257/13, 79, E33.033; 372/45.012
See application file for complete search history.

(56) References Cited

U.S. PATENT DOCUMENTS 6,924,512 B1 * 8/2005 Tsuda et al. .................. 257/97
2005/0148194 A1 * 7/2005 Lan et al. .................. 438/706

* cited by examiner

*Primary Examiner*—Jerome Jackson
*Assistant Examiner*—Jesse A. Fenty

(57) ABSTRACT

A gallium-nitride based light-emitting diode structure includes a digital penetration layer to raise its reverse withstanding voltage and electrostatic discharge. The digital penetration layer is formed by alternate stacking layers of $Al_xIn_yGa_{1-x-y}N_zP_{1-z}/Al_pIn_qGa_{1-p-q}N_rP_{1-r}$, wherein $0 \leq x,y,z, p,q,r \leq 1$, and $Al_xIn_yGa_{1-x-y}N_zP_{1-z}$ has an energy gap greater than that of $Al_pIn_qGa_{1-p-q}N_rP_{1-r}$. The $Al_xIn_yGa_{1-x-y}N_zP_{1-z}$ layers have increasing thickness and the $Al_pIn_qGa_{1-p-q}N_rP_{1-r}$ layers have decreasing thickness.

10 Claims, 5 Drawing Sheets

LIGHT-EMITTING DIODE STRUCTURE

BACKGROUND OF THE INVENTION

1. Field of the Invention

The present invention relates to a gallium-nitride (GaN) based light-emitting diode (LED) structure, and in particular to the gallium-nitride (GaN) based light-emitting diode with high reverse withstanding voltage and high electrostatic discharge (ESD) capabilities.

2. The Prior Arts

A number of image displaying devices are currently utilized, including a cathode ray tube (CRT) display, a liquid crystal display (LCD), and a light-emitting diode (LED) based display. Usually, the liquid crystal display is suitable for displaying dynamic images, while the display made of LED is suitable for displaying static images.

In the field of light-emitting diodes, the gallium-nitride (GaN) based light-emitting diode is the focus of research and development of the industry in recent years. Its main feature lies in that it can be made to emit lights of various colors by adjusting its material compositions. The field of its application has been expanded tremendously, due to the significant breakthrough and development of the technology in enhancing its light illumination and light emitting efficiency.

In general, the indium-gallium-nitride (InGaN)/gallium-nitride (GaN) multi-quantum well (MQW) LED is used in the prior art as the light emitting device, and it has been widely utilized in the various functions and applications of static display, for example, in addition to being used in the electronic clocks and watches, it can be utilized in the application of various display screens and advertisement panels/billboards, etc.

When it is used as the outdoor display screen and advertisement panel and billboard, due to the much more stringent conditions of the operation environment, the light-emitting diode must have sufficiently high withstanding voltage and high electrostatic discharge (ESD) capabilities, so that it can maintain normal, stable, and sustained period of operations, and be able to fully achieve its functions of light-emitting and illumination.

In the following discussion, a general structure and a manufacturing process of the conventional gallium-nitride (GaN) based light-emitting diode will be described.

With reference to FIG. 1 of the attached drawings, the conventional gallium-nitride (GaN) based light-emitting diode 10 comprising: a substrate 11, a buffer layer 12 formed on the substrate 11, an n-type gallium-nitride (GaN) layer 13 formed on the buffer layer 12, a light-emitting stack layer 14 formed on the n-type gallium-nitride (GaN) layer 13, and a p-type gallium-nitride layer 15 formed on the light-emitting stack layer 14.

Dry etching is employed to etch downward through the p-type gallium-nitride layer 15, the light-emitting stack layer 14 and finally reaching the n-type gallium-nitride (GaN) layer 13 to form an N-metal formation region 16.

Afterwards, a transparent conductive layer 17 is formed on the p-type gallium-nitride layer 15, serving as a p-type ohmic contact and being transparent. An N-metal 18, serving as an n-ohmic contact, is formed on the N-metal formation region 16. Welding pads 19 are then formed on the transparent conductive layer 17 and the N-metal 18 respectively.

However, as indicated by the characteristic curve (a) illustrated in FIG. 4 and the characteristic curve (a) of FIG. 5, the values of the reverse withstanding voltage and the electrostatic discharge of the conventional gallium-nitride based light-emitting diode structure are rather too low, which are not high enough to make the light-emitting diode structure sustain long period of high level light emitting and/or illumination performance in the stringent outdoor environment conditions.

Therefore, the purpose of the present invention is to overcome and improve the above-mentioned shortcomings and restrictions of the light-emitting diode of the prior art, so as to achieve the purpose of significantly raise its reverse withstanding voltage and electrostatic discharge, and thus increase its service life.

SUMMARY OF THE INVENTION

A primary objective of the present invention is to provide a gallium-nitride based light-emitting diode structure with the digital penetration layer, so as to overcome and improve the shortcomings and restrictions of the light-emitting diode of the prior art regarding this respect, and thus significantly raise its reverse withstanding voltage and electrostatic discharge.

Another objective of the present invention is to provide a device, which reduces the resistance between the transparent conductive layer and the p-type gallium-nitride contact layer. This device can be utilized to make the contact between the above-mentioned transparent conductive layer or transparent conductive oxide layer and the p-type gallium-nitride contact layer to be the ohmic contact, by means of the digital penetration layer disposed between the two layers, which can perform the carriers penetration therein, and thus be able to reduce the resistance between the two layers.

Yet another objective of the present invention is to provide a material that can perform carrier penetration therein.

In the present invention, the traditional Ni/Au is substituted for a material with better light transmittance such as indium-tin-oxide (ITO) as the transparent conductive layer. However, since the contact between this ITO material and the p-type gallium-nitride material is not ohmic contact, a digital penetration layer must be inserted in between with its structure as shown in FIG. 3, which makes the contact between the two layers to be the ohmic contact through the carrier penetration effects of the layer, thus reducing the resistance between the two layers.

As mentioned above, the purpose of the present invention is to provide a gallium-nitride based light-emitting diode structure with the digital penetration layer, which is constructed with the following steps: first, providing a substrate; then, a series of semiconductor stack layers are formed on the substrate, with this series of semiconductor stack layers comprising the layers stacked from bottom to top: a buffer layer, a n-type gallium-nitride contact layer, a light-emitting stack layer, and a p-type gallium-nitride contact layer; and then a digital penetration layer is formed on the p-type gallium-nitride contact layer.

Afterwards, etching downward by means of dry etching, and passing in sequence the digital penetration layer, the p-type gallium-nitride contact layer, the light-emitting stack layer, and terminating on the top of the n-type gallium-nitride contact layer.

And finally, a first ohmic contact electrode is formed over the digital penetration layer, and on the surface not covered by the transparent conductive layer to serve as the p-type ohmic contact; and a second ohmic contact electrode is formed on the n-type gallium-nitride contact layer to serve as the n-type ohmic contact. And in this manner, the light-emitting diode structure of the present invention with the significantly raised reverse withstanding voltage and electrostatic discharge is thus constructed accordingly.

The object and the various advantages of the present invention will be more evident through the following detailed descriptions of the preferred embodiment with reference to the attached drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

Now, the preferred embodiment of the present invention will be described with reference to the attached drawings. Wherein, the different portions of certain elements are not drawn to exact scale, and certain scales and the related scales of other portions are intently exaggerated to provide clearer description and facilitate the people familiar with the art to understand the present invention more thoroughly.

Figure 1:
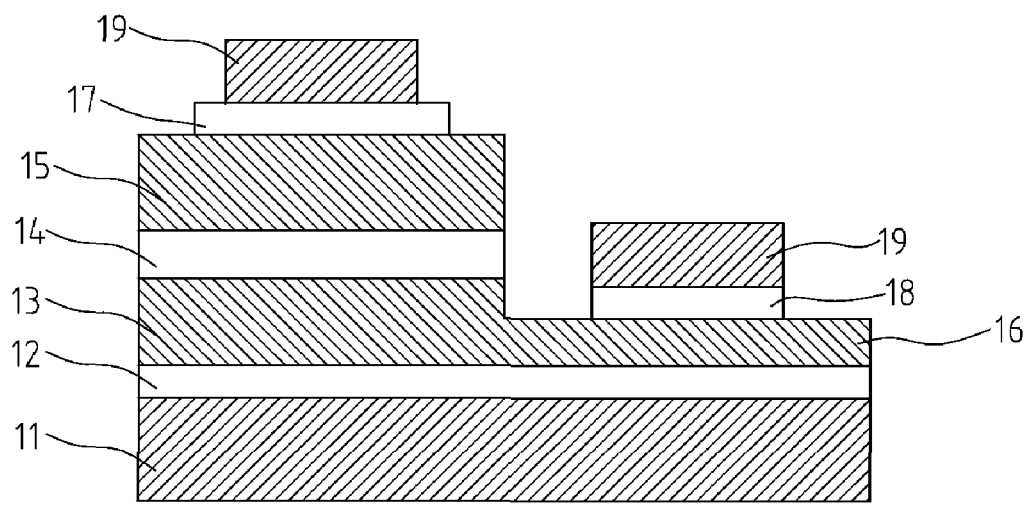
FIG. 1 is the gallium-nitride based light-emitting diode structure according to the prior art.
Figure 2:
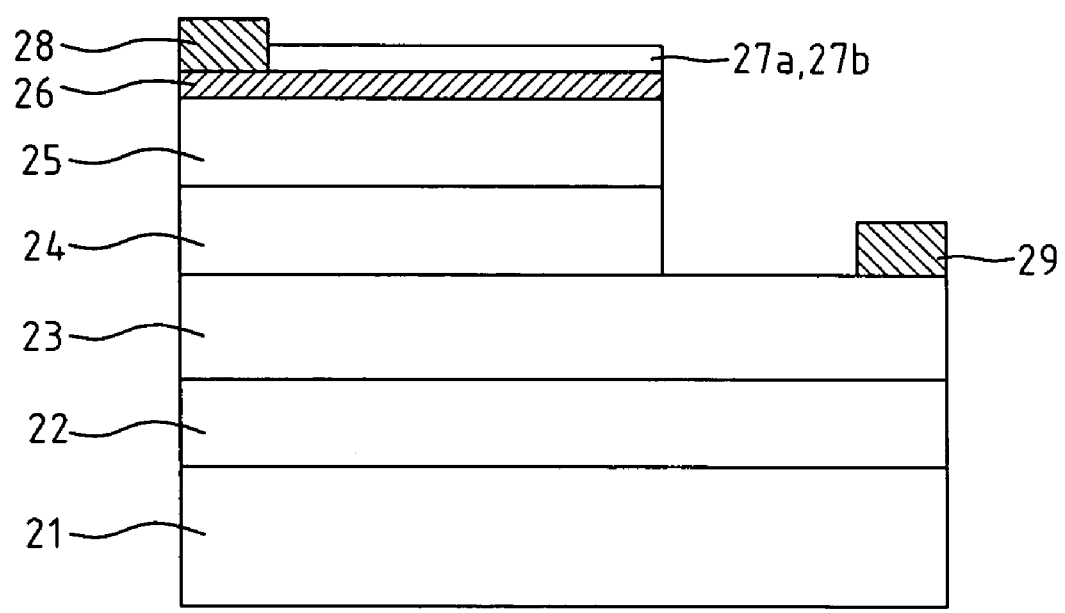
FIG. 2 is the gallium-nitride based light-emitting diode structure according to the preferred embodiment of the present invention.
Figure 3:
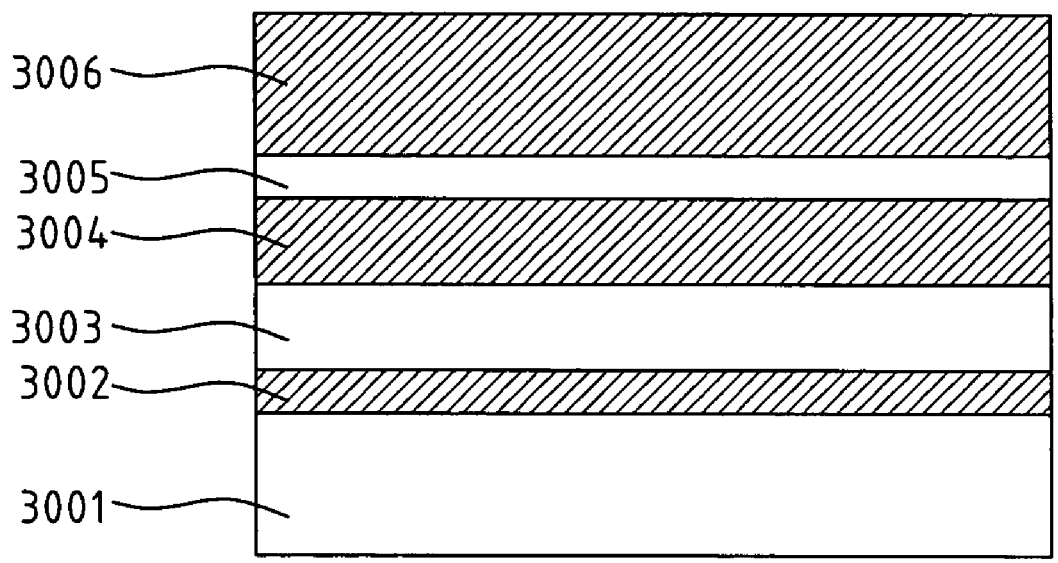
FIG. 3 is the gallium-nitride based light-emitting diode structure with the digital penetration layer according to the preferred embodiment of the present invention.

FIG. 2 indicates the gallium-nitride based light-emitting diode structure 20 with raised reverse withstanding voltage and electrostatic discharge, comprising: a substrate 21 a buffer layer 22, an n-type gallium-nitride (GaN) layer 23, a light-emitting stack layer 24. a p-type gallium-nitride (GaN) layer 25, a digital penetration layer 26, a transparent conductive layer 27a or a transparent conductive oxide layer 27b, a first ohmic electrode 28, and a second ohmic electrode 29.

In the above-mentioned structure, the bottom layer of the light-emitting diode structure is the substrate 21, and it is made of the material of one of the following: Sapphire, 6H-Sic, 4H-Sic, ZnO, GaAs, $MgAl_2O_4$, and a single crystal oxide with its lattice constant close to that of nitride semiconductor.

Next, the buffer layer 22 is formed on the substrate 21, and it is made of $Al_{1-a-b}Ga_aIn_bN$ with specific composition, wherein, $0 \leq a$, $b<1$, $a+b \leq 1$.

Then, n-type gallium-nitride layer 23 is formed on the buffer layer 22. It is a contact layer, its growth temperature is 900–1200° C, and its thickness is 2–5μm.

And next, the light-emitting stack layer 24 is formed on the n-type gallium-nitride layer, and it is made of material of specific $Al_{1-x-y}Ga_xIn_yN$, wherein $0<x,y<1$, $x+y \leq 1$, it usually is InGaN, and its growth temperature is 700–900° C.

Then, the p-type gallium-nitride layer 25 is formed on the light-emitting stack layer. It is a contact layer, its growth temperature is 900–1200° C., and its thickness is less than 5000 Å.

Next, the digital penetration layer 26 is formed on the p-type gallium-nitride contact layer. This is the specifically designed layer of the present invention, and it has the light transmittance of greater than 80% for the light of wavelength 365–560 nm. The carrier penetration can be performed therein by means of the carrier penetration effect, and its purpose is to make: the contact between the p-type gallium-nitride layer 25 and the following described transparent conductive layer 27a or transparent conductive oxide layer 27b to be the ohmic contact. Afterwards, etching from the digital penetration layer downwards by means of dry etching, passing through the p-type gallium-nitride layer, the light emitting stack layer, and reaching on top of the n-type gallium-nitride layer.

Then, the transparent conductive layer 27a is formed on the digital penetration layer 26, and it is made of the material of one of the following: Ni/Au, Ni/Pt, Ni/Pd, Pd/Au, Pt/Au, Cr/Au, Ni/AuBe, Ni/Cr/Au, Ni/Pt/Au, Ni/Pd/Au or the like; or the transparent conductive oxide layer 27b is formed on the digital penetration layer 26, and it is made of the material of one of the following: ITO, CTO, ZnO, InO or the like.

Next, a first ohmic contact electrode 28 is formed over the digital penetration layer 26, and on the surface not covered by the transparent conductive layer to serve as the p-type ohmic contact, and it is made of the material of one of the following: Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x(x \geq 0)$, $WSi_y(y \geq 0)$.

And finally, a second ohmic contact electrode 29 is formed on the n-type gallium-nitride layer 23 to serve as the n-type ohmic contact, and it is made of the material of one of the following: Ti/Al alloy, Ti/Al/Ti/Au alloy, Ti/Al/Ni/Au alloy, Ti/Al/Pt/Au alloy, Ti/Au alloy, and Cr/Au alloy.

Through the above detailed description and explanation, the gallium-nitride based light-emitting diode structure with raised reverse withstanding voltage and electrostatic discharge of the present invention can thus be made accordingly. Wherein, the more detailed structure of the digital penetration layer 26 is described as follows; it is constructed in a two-by-two alternate stacking manner by two incrementing thickness (2 Å to 20 Å) and/or decrementing thickness (20 Å to 2 Å) sub-layers of material $Al_xIn_yGa_{1-x-y}N_zP_{1-z}/Al_pIn_qGa_{1-p-q}N_rP_{1-r}$, the number of repetition is greater than 2, and its overall thickness is less than or equal to 100 Å, and wherein $0 \leq x,y,z,p,q,r \leq 1$. The energy gap of $Al_xIn_yGa_{1-x-y}N_zP_{1-z}$ must be wider than that of $Al_pIn_qGa_{1-p-q}N_rP_{1-r}$. Their electric conduction can be P-type, N-type, or I-type. However, it is not necessary that all of them are P-type, N-type, or I-type at the same time. In addition, according to the verification of experiments, the optimized thickness and compositions of the respective sub-layers of the digital penetration layer 100 are as follows:

Sub-layer 3001: is made of I-type undoped GaN, and its thickness is 20 Å;

Sub-layer 3002: is made of N-type InGaN, and its thickness is 5 Å;

Sub-layer 3003: is made of N-type GaN, and its thickness is 10 Å;

Sub-layer 3004: is made of N-type InGaN, and its thickness is 10 Å;

Sub-layer 3005: is made of N-type GaN, and its thickness is 5 Å; and

Sub-layer 3006: is made of I-type undoped InGaN, and its thickness is 20 Å.

In the above-mentioned FIG. 2, the digital penetration layer 26 is formed between the p-type gallium-nitride layer 25 and the transparent conductive layer 27a or transparent conductive oxide layer 27b, and the carrier penetration can be performed within the digital penetration layer, so that the contact between the p-type gallium-nitride layer and the transparent conductive layer is made to be the ohmic contact. As such the light-emitting diode structure of the present invention is made to have the increased reverse withstanding voltage and electrostatic discharge capabilities. The above description will be explained in detail as follows by means of the characteristic curves in FIG. 4 and FIG. 5 respectively.

Figure 4:
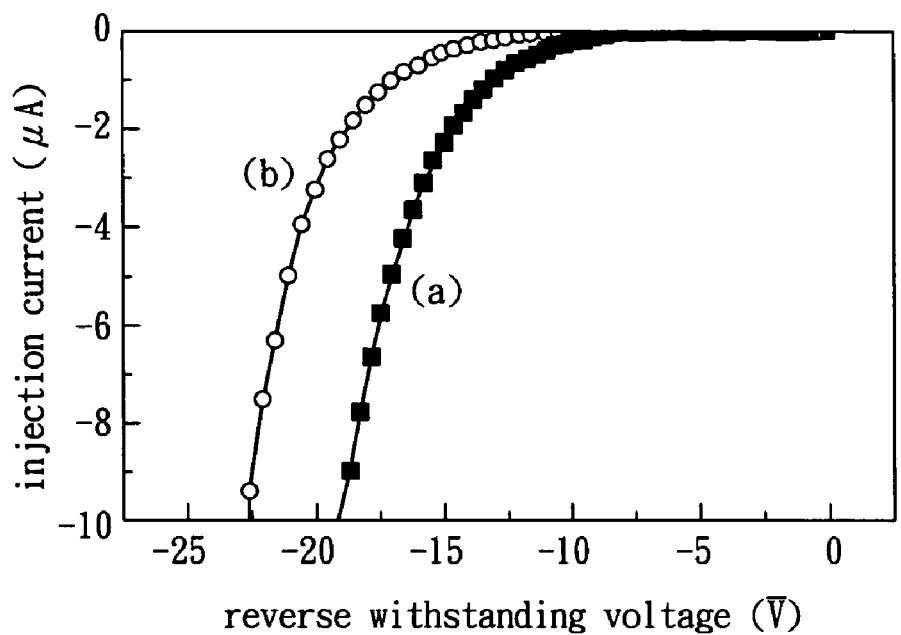
FIG. 4 is the comparison of the reverse withstanding voltage characteristic curve of the gallium-nitride based light-emitting diode structure with the digital penetration layer according to the preferred embodiment of the present invention vs. that of the gallium-nitride based light-emitting diode structure of the prior art.

As shown in FIG. 4, the characteristic curves indicate the reverse withstanding voltage (V) (horizontal axis) vs. its injection current (μA) (vertical axis) for the light-emitting diode. Curve (a) represents the related characteristic curve of the conventional light-emitting diode w/o the digital penetration layer. Curve (b) represents the related characteristic curve of the light-emitting diode with the digital penetration layer according to the preferred embodiment of the present invention. From these two curves it is evident that when the injection current of the light-emitting diode of the present invention is in the range of 0 to −10 μA, the absolute value of its reverse withstanding voltage is greater than that of the light-emitting diode of the prior art.

Figure 5:
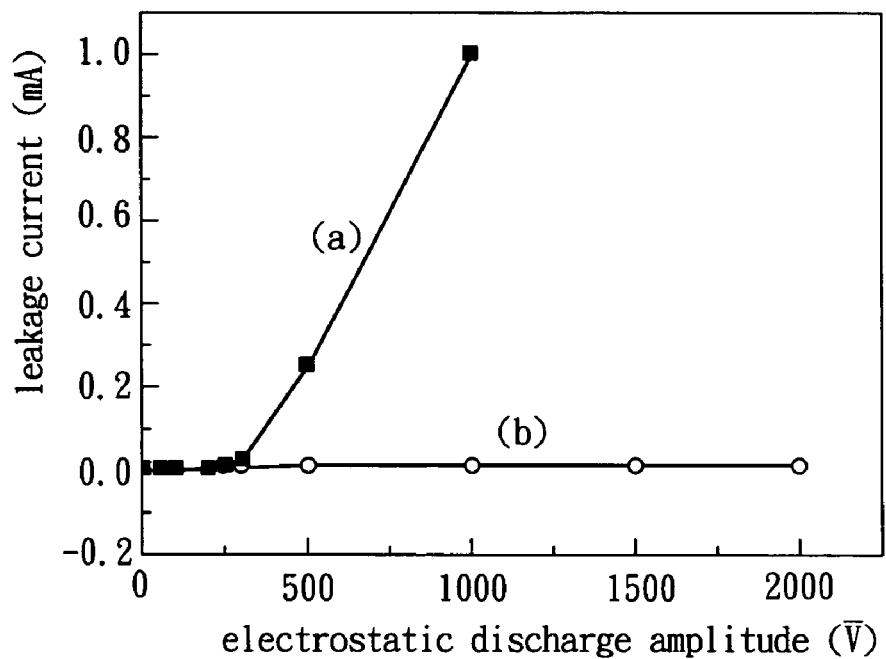
FIG. 5 is the comparison of the electrostatic discharge characteristic curve of the gallium-nitride based light-emitting diode structure with the digital penetration layer according to the preferred embodiment of the present invention vs. that of the gallium-nitride based light-emitting diode structure of the prior art.

As shown in FIG. 5, the characteristic curves indicate the leakage current (mA) (vertical axis) vs. the electrostatic discharge (ESD) amplitude (V) (horizontal axis) for the light-emitting diode, wherein Curve (a) represents the related characteristic curve of the conventional light-emitting diode w/o the digital penetration layer while curve (b) represents the related characteristic curve of the light-emitting diode with the digital penetration layer according to the preferred embodiment of the present invention. From the two curves in the drawing it is evident that: for the ESD amplitude of the conventional light-emitting diode at 1000V in the range of 0–2000V, the leakage current increases significantly to 1.0 mA; however, for the ESD amplitude of the light-emitting diode of the present invention in the entire range of 0–2000V, its leakage current is always kept at 0 mA, and is always less than that of the light-emitting diode w/o the digital penetration layer of the prior art.

From the above discussion it is evident that the functions of the reverse withstanding voltage and electrostatic discharge of the light-emitting diode of the present invention are indeed superior to those of the light-emitting diode of the prior art. Therefore, the present invention does have application value in the industry and is in conformity with the patent requirements.

The purpose of the preferred embodiment described above is only illustrative, and it is not intended to be construed as to be any restrictions to the present invention. Therefore, any variations or modifications made within the spirit and scope of the present invention can be included in the scope of protection of the attached claims.

What is claimed is:

1. A light-emitting diode structure, comprising:
   a substrate made of a material selected from a group consisting of Sapphire, 6H-Sic, 4H-Sic, ZnO, GaAs, $MgAl_2O_4$, and a single crystal oxide with a lattice constant close to that of a nitride semiconductor;
   a buffer layer formed on said substrate, and made of $Al_{1-a-b}Ga_aIn_bN$, wherein $0 \leq a, b < 1$, and $a+b \leq 1$;
   an n-type gallium-nitride contact layer formed on said buffer layer, said n-type gallium-nitride contact layer having 900–1200° C. growth temperature, and 2–5 μm thickness;
   a light-emitting stack layer formed on said n-type gallium-nitride contact layer, and made of $Al_{1-x-y}Ga_xIn_yN$ with 700–900° C. growth temperature, wherein $0<x, y<1$, and $x+y \leq 1$;
   a p-type gallium-nitride contact layer formed on said light-emitting stack layer, said p-type gallium-nitride contact layer having 900–1200° C. growth temperature, and thickness less than 5000 Å;
   a digital penetration layer formed on said p-type gallium-nitride contact layer;
   a transparent conductive layer formed on said digital penetration layer, and made of a material selected from a group consisting of Ni/Au, Ni/Pt, Ni/Pd, Pd/Au, Pt/Au, Cr/Au, Ni/AuBe, Ni/Cr/Au, Ni/Pt/Au, and Ni/Pd/Au;
   a first ohmic contact electrode formed over a portion of said digital penetration layer not covered by said transparent conductive layer to serve as a p-type ohmic contact, said first ohmic contact electrode being made of a material selected from a group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$, $(x \geq 0)$, and $WSi_y$ $(y \leq 0)$; and
   a second ohmic contact electrode formed over a portion of said n-type gallium-nitride layer to serve as an n-type ohmic contact, said second ohmic contact electrode being made of a material selected from a group consisting of Ti/Al alloy, Ti/Al/Ti/Au alloy, Ti/Al/Ni/Au alloy, Ti/Al/Pt/Au alloy, Ti/Au alloy, and Cr/Au alloy.

2. The light-emitting diode structure as claimed in claim 1, wherein said digital penetration layer comprises alternate stacking layers of $Al_xIn_yGa_{1-x-y}N_zP_{1-z}/Al_pIn_qGa_{1-p-q}N_rP_{1-r}$ with $Al_xIn_yGa_{1-x-y}N_zP_{1-z}$ having increasing thickness in a range between 2 Å to 20 Å and $Al_pIn_qGa_{1-p-q}N_rP_{1-r}$ having decreasing thickness in a range between 20 Å to 2 Å, wherein $0 \leq x,y,z,p,q,r \leq 1$, and $Al_xIn_yGa_{1-x-y}N_zP_{1-z}$ has an energy gap greater than that of $Al_pIn_qGa_{1-p-q}N_rP_{1-r}$.

3. The light-emitting diode structure as claimed in claim 2, wherein said digital penetration layer has more than two repetitions of $Al_xIn_yGa_{1-x-y}N_zP_{1-z}/Al_pIn_qGa_{1-p-q}N_rP_{1-r}$ layers with overall thickness being less than or equal to 100 Å.

4. The light-emitting diode structure as claimed in claim 2, wherein each layer of said alternate stacking layers of $Al_xIn_yGa_{1-x-y}N_zP_{1-z}/Al_pIn_qGa_{1-p-q}N_rP_{1-r}$ has electric conduction type being P-type, N-type, or I-type, and said alternate stacking layers may comprise layers with different electric conduction types.

5. The light-emitting diode structure as claimed in claim 1, wherein said digital penetration layer comprises a first layer made of I-type undoped GaN with 20 Å thickness, a second layer made of N-type InGaN with 5 Å thickness, a third layer made of N-type GaN with 10 Å thickness, a fourth layer made of N-type InGaN with 10 Å thickness, a fifth layer made of N-type GaN with 5 Å thickness, and a sixth layer made of I-type undoped InGaN with 20 Å thickness.

6. A light-emitting diode structure, comprising:
   a substrate made of a material selected from a group consisting of Sapphire, 6H-Sic, 4H-Sic, ZnO, GaAs, $MgAl_2O_4$, and a single crystal oxide with a lattice constant close to that of a nitride semiconductor;
   a buffer layer formed on said substrate, and made of $Al_{1-a-b}Ga_aIn_bN$, wherein $0 \leq a, b < 1$, and $a+b \leq 1$;

an n-type gallium-nitride contact layer formed on said buffer layer, said n-type gallium-nitride contact layer having 900–1200° C. growth temperature, and 2–5 μm thickness;

a light-emitting stuck layer formed on said n-type gallium-nitride contact layer, and made of $Al_{1-x-y}Ga_xIn_yN$ with 700–900° C. growth temperature, wherein 0<x, y<1, and x+y≦1;

a p-type gallium-nitride contact layer formed on said light-emitting stack layer, said p-type gallium-nitride contact layer having 900–1200° C. growth temperature, and thickness less than 5000 Å;

a digital penetration layer formed on said p-type gallium-nitride contact layer;

a transparent conductive oxide layer formed on said digital penetration layer, and made of a material selected from a group consisting of ITO, CTO, ZnO, and InO;

a first ohmic contact electrode formed over a portion of said digital penetration layer not covered by said transparent conductive oxide layer to serve as a p-type ohmic contact, said first ohmic contact electrode being made of a material selected from a group consisting of Ni/Au alloy, Ni/Pt alloy, Ni/Pd alloy, Ni/Co alloy, Pd/Au alloy, Pt/Au alloy, Ti/Au alloy, Cr/Au alloy, Sn/Au alloy, Ta/Au alloy, TiN, $TiWN_x$ (x≧0), and $WSi_y$ (y≧0); and a second ohmic contact electrode formed over a portion of said n-type gallium-nitride layer to serve as an n-type ohmic contact, said second ohmic contact electrode being made of a material selected from a group consisting of Ti/Al alloy, Ti/Al/Ti/Au alloy, Ti/Al/Ni/Au alloy, Ti/Al/Pt/Au alloy, Ti/Au alloy, and Cr/Au alloy.

7. The light-emitting diode structure as claimed in claim 6, wherein said digital penetration layer comprises alternate stacking layers of $Al_xIn_yGa_{1-x-y}N_zP_{1-z}/Al_pIn_qGa_{1-p-q}N_rP_{1-r}$ with $Al_xIn_yGa_{1-x-y}N_zP_{1-z}$ having increasing thickness in a range between 2 Å to 20 Å and $Al_pIn_qGa_{1-p-q}N_rP_{1-r}$ having decreasing thickness in a range between 20 Å to 2 Å, wherein 0≦x,y,z,p,q,r≦1, and $Al_xIn_yGa_{1-x-y}N_zP_{1-z}$ has an energy gap greater than that of $Al_pIn_qGa_{1-p-q}N_rP_{1-r}$.

8. The light-emitting diode structure as claimed in claim 7, wherein said digital penetration layer has more than two repetitions of $Al_xIn_yGa_{1-x-y}N_zP_{1-z}/Al_pIn_qGa_{1-p-q}N_rP_{1-r}$ layers with overall thickness being less than or equal to 100 Å.

9. The light-emitting diode structure as claimed in claim 7, wherein each layer of said alternate stacking layers of $Al_xIn_yGa_{1-x-y}\ N_zP_{1-z}/Al_pIn_qGa_{1-p-q}N_rP_{1-r}$ has electric conduction type being P-type, N-type, or I-type, and said alternate stacking layers may comprise layers with different electric conduction types.

10. The light-emitting diode structure as claimed in claim 6, wherein said digital penetration layer comprises a first layer made of I-type undoped GaN with 20 Å thickness, a second layer made of N-type InGaN with 5 Å thickness, a third layer made of N-type GaN with 10 Å thickness, a fourth layer made of N-type InGaN with 10 Å thickness, a fifth layer made of N-type GaN with 5 Å thickness, and a sixth layer made of I-type undoped InGaN with 20 Å thickness.

* * * * *